United States Patent
Sugimoto et al.

(10) Patent No.: US 11,405,111 B2
(45) Date of Patent: Aug. 2, 2022

(54) RECEIVING CIRCUIT AND OPTICAL RECEIVER

(71) Applicant: SUMITOMO ELECTRIC INDUSTRIES, LTD., Osaka (JP)

(72) Inventors: Yoshiyuki Sugimoto, Osaka (JP); Seiji Kumagai, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 41 days.

(21) Appl. No.: 17/103,092

(22) Filed: Nov. 24, 2020

(65) Prior Publication Data

US 2021/0167863 A1 Jun. 3, 2021

(30) Foreign Application Priority Data

Nov. 29, 2019 (JP) .............................. JP2019-217136

(51) Int. Cl.
*H04B 10/61* (2013.01)
*H03F 3/08* (2006.01)

(52) U.S. Cl.
CPC ............... *H04B 10/61* (2013.01); *H03F 3/08* (2013.01)

(58) Field of Classification Search
CPC ......... H04B 10/61; H04B 10/691; H03F 3/08; H03F 3/45977; H03F 2200/435; H03F 3/45475
See application file for complete search history.

(56) References Cited

U.S. PATENT DOCUMENTS

| 4,623,786 | A | 11/1986 | Rodwell |
| 6,275,541 | B1 | 8/2001 | Nagahori |
| 2010/0231295 | A1 | 9/2010 | Hara |
| 2015/0188525 | A1* | 7/2015 | Yen ........................ H03K 5/003 327/307 |
| 2017/0163352 | A1 | 6/2017 | Sugimoto |
| 2019/0052370 | A1* | 2/2019 | Pang .................. H04B 10/6971 |

FOREIGN PATENT DOCUMENTS

| JP | S57-046544 | 3/1982 |
| JP | S61-161008 | 7/1986 |
| JP | H11-008522 | 1/1999 |
| JP | 2010-213128 | 9/2010 |
| JP | 2017-103636 | 6/2017 |

* cited by examiner

*Primary Examiner* — Thanh Luu
*Assistant Examiner* — Monica T Taba
(74) *Attorney, Agent, or Firm* — Smith, Gambrell & Russell, LLP.

(57) ABSTRACT

A receiving circuit and an optical receiver including the receiving circuit are disclosed. The receiving circuit includes first and second input terminals, a FET, first and second TIA circuits, and a control circuit. The first and second input terminals each receive a current signal. The FET has first and second current terminals respectively connected to the first and second input terminals, and a control terminal. The first and second TIA circuits respectively are connected to the first and second current terminals, and convert the current signals to first and second voltage signals. The control circuit generates a control signal for application to the FET control terminal in accordance with a difference between the first and second voltage signals. The optical receiver includes the receiving circuit and each of first and second photodetectors for respectively supplying first and second current signals to the first and second input terminals of the receiver.

12 Claims, 11 Drawing Sheets

US 11,405,111 B2

RECEIVING CIRCUIT AND OPTICAL RECEIVER

CROSS-REFERENCE TO RELATED APPLICATION

This application is based upon and claims the benefit of priority from Japanese Patent Application No. 2019-217136, filed on Nov. 29, 2019, the entire contents of which are incorporated herein by reference.

TECHNICAL FIELD

The present disclosure relates to a receiving circuit and an optical receiver.

BACKGROUND

In an optical receiver, a pair of optical signals may be input as a differential signal to a pair of photodetectors. For example, with the recent increase in capacity of optical communication, digital coherent optical transmission systems have often been used for long-distance communication. In the digital coherent optical transmission system, an optical receiver causes received signal light to interfere with local light. Thereafter, one light component of generated differential signal light is input to a first photodetector and the other light component of the differential signal light is input to a second photodetector. Then, a current signal output from the first photodetector is converted to a voltage signal by a transimpedance amplifier (TIA), and a current signal output from the second photodetector is converted to a voltage signal by another TIA. A difference between the voltage signals is output from the optical receiver as a reception signal.

SUMMARY

The present disclosure provides a receiving circuit. The receiving circuit generates a first voltage signal and a second voltage signal in accordance with a first current signal output from a first photodetector and a second current signal output from a second photodetector. The receiving circuit includes a first input terminal, a second input terminal, a first field effect transistor (FET), a first transimpedance amplifier (TIA) circuit, a second TIA circuit, and a control circuit. The first input terminal is configured to receive the first current signal. The second input terminal is configured to receive the second current signal. The first FET has a first current terminal, a second current terminal, and a first control terminal. The first current terminal is electrically connected to the first input terminal. The second current terminal is electrically connected to the second input terminal. The first control terminal receives a first control signal. The first TIA circuit has a first input node and a first output node. The first input node is electrically connected to the first current terminal of the first FET. The first TIA circuit is configured to convert a current signal received at the first input node to the first voltage signal and output the first voltage signal from the first output node. The second TIA circuit has a second input node and a second output node. The second input node is electrically connected to the second current terminal of the first FET. The second TIA circuit is configured to convert a current signal received at the second input node to the second voltage signal and output the second voltage signal from the second output node. The control circuit generates the first control signal in accordance with a voltage difference between the first voltage signal and the second voltage signal.

DETAILED DESCRIPTION

Figure 1:
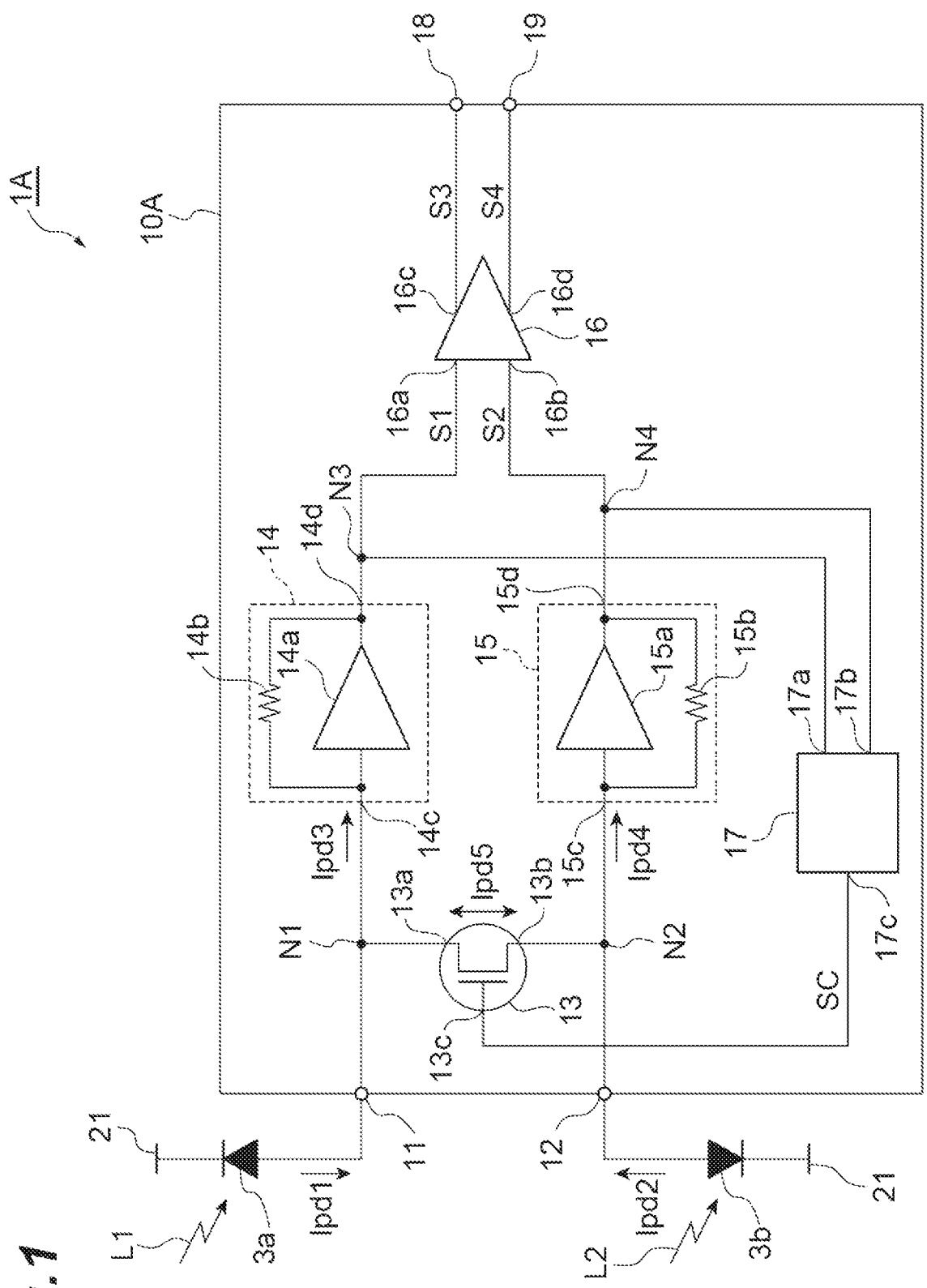
FIG. 1 is a circuit diagram illustrating a configuration of an optical receiver according to an embodiment of the present disclosure.

Specific examples of a receiving circuit and an optical receiver according to an embodiment of the present disclosure will be described below with reference to the drawings. The present invention is not limited to the examples, but is indicated by the appended claims and is intended to include all modifications within the meaning and scope equivalent to the appended claims. In the following description, the same elements will be designated by the same reference numerals in the description of the drawings, and redundant description will be omitted.

FIG. 1 is a circuit diagram illustrating a configuration of an optical receiver 1A according to an embodiment of the present disclosure. The optical receiver 1A includes a photodetector 3a (first photodetector), a photodetector 3b (second photodetector), and a receiving circuit 10A. A digital coherent receiver causes received light to interfere with local oscillation light in an optical 90-degree hybrid. As a result, a pair of signal light L1 and L2 is generated as a differential signal light. In the optical receiver 1A, the signal light L1 is received by the photodetector 3a, and the signal light L2 is received by the photodetector 3b. The photodetector 3a and the photodetector 3b are, for example, photodiodes. The photodetector 3a has the same optical characteristics and the same electrical characteristics as those of the photodetector 3b.

The receiving circuit 10A receives a current signal Ipd1 (a first current signal) output from the photodetector 3a and converts the current signal Ipd1 to a voltage signal S1 (a first voltage signal). The receiving circuit 10A receives a current signal Ipd2 (a second current signal) output from the photodetector 3b and converts the current signal Ipd2 to a voltage signal S2 (a second voltage signal). Since the signal light L1 and L2 input to the photodetectors 3a and 3b are complementary to each other, the current signals Ipd1 and Ipd2 are also complementary signals. The complementary signals mentioned herein mean, for example, that the current signal Ipd2 reduces when the current signal Ipd1 increases and the current signal Ipd2 increases when the current signal Ipd1 reduces. For example, the current signal Ipd2 has a minimum value (a bottom value) when the current signal Ipd1 has a maximum value (a peak value) and the current signal Ipd2 has a maximum value when the current signal Ipd1 has a minimum value. The intensity (amplitude) of the current signal Ipd1 is the same as the intensity (amplitude) of the current signal Ipd2. That is, a pair of current signals Ipd1 and Ipd2 is a differential current signal. This meaning of the complementary signals is true of the voltage signals. That is, a pair of voltage signals S1 and S2 is a differential voltage signal. It is preferable that the voltage signal S1 have the same temporal mean value as the temporal mean value of the voltage signal S2. The receiving circuit 10A includes a first input terminal 11, a second input terminal 12, a field effect transistor (FET) 13, a TIA circuit 14, a TIA circuit 15, a buffer amplifier 16, and a control circuit 17. The receiving circuit 10A may have a package which is independent of the photodetectors 3a and 3b. The receiving circuit 10A may be formed on a single semiconductor chip.

The first input terminal 11 and the second input terminal 12 are, for example, lead terminals protruding from the package of the receiving circuit 10A. The first input terminal 11 is electrically connected to an anode of the photodetector 3a via a line provided outside of the package. A cathode of the photodetector 3a is electrically connected to a bias line 21. The photodetector 3a is supplied with a bias voltage, for example, from a DC power source or a bias circuit via the bias line 21. The voltage of the bias line 21 is, for example, 5 V. The signal light L1 is incident on the photodetector 3a The photodetector 3a converts the signal light L1 to a current signal (a photocurrent) and outputs the current signal Ipd1. The first input terminal 11 is configured to receive the current signal Ipd1 from the photodetector 3a.

The second input terminal 12 is electrically connected to the anode of the photodetector 3b via a line provided outside of the package. The cathode of the photodetector 3b is electrically connected to the bias line 21 and is supplied with a bias voltage from the DC power source or the bias circuit via the bias line 21. This bias line 21 may have a potential shared by that of the bias line 21 connected to the cathode of the photodetector 3a The signal light L2 is incident on the photodetector 3b. The photodetector 3b converts the signal light L2 to a current signal (a photocurrent) and outputs the current signal Ipd2. The second input terminal 12 is configured to receive the current signal Ipd2 from the photodetector 3b. When the receiving circuit 10A is formed on a single semiconductor chip, the first input terminal 11 and the second input terminal 12 are formed, for example, as individual bonding pads in a peripheral portion of the semiconductor chip. In this case, the first input terminal 11 and the second input terminal 12 are electrically connected to the photodetectors 3a and 3b by bonding wires, respectively. The current signals Ipd1 and Ipd2 are a pair of complementary current signals. The current signals Ipd1 and Ipd2 constitute a single differential input current. That is, the photodetectors 3a and 3b output a single differential input current and the receiving circuit 10A receives the differential input current via the first input terminal 11 and the second input terminal 12.

The FET 13 is a first FET in this embodiment. The FET 13 includes two current terminals (a source and a drain) 13a and 13b and one control terminal (a gate) 13c. The FET 13 is used as a variable resistor as will be described later. Accordingly, distinction between the current terminal 13a (the first current terminal) and the current terminal 13b (the second current terminal) is for convenience of explanation. For example, the current terminal 13a may be a source and the current terminal 13b may be a drain, or the current terminal 13a may be a drain and the current terminal 13b may be a source. Even when the two current terminals 13a and 13b are exchanged with each other, the FET 13 operates in the same way as when they are not exchanged and has the same electrical characteristics as when they are not exchanged. No change in electrical characteristics when the two current terminals are exchanged may be expressed as the two current terminals having symmetry. If single FET does not have such symmetry, the FET 13 having symmetry equivalently can be constituted by using two FETs. For example, a drain of one FET is connected to a source of the other FET, and a source of the one FET is connected to a drain of the other FET.

The FET 13 is provided to cause an alternating current to flow between the first input terminal 11 and the second input terminal 12. Each of the current signals Ipd1 and Ipd2 includes an alternating current (AC) component and a direct current (DC) component. The AC component corresponds to a signal component varying in an alternating-current manner. The current terminal 13a of the FET 13 is electrically connected to the first input terminal 11 via a line in the receiving circuit 10A. The current terminal 13b of the FET 13 is electrically connected to the second input terminal 12 via a line in the receiving circuit 10A. A resistance (a first resistance) between two current terminals 13a and 13b of the FET 13 varies according to a control signal (a first control signal) SC applied to the control terminal 13c of the FET 13. For example, when the FET 13 is an N-channel FET, the voltage of the control signal SC applied to the control terminal 13c is set to be greater than a value obtained by adding a predetermined voltage (a threshold voltage) to the voltage between the two current terminals 13a and 13b. Accordingly, the two current terminals 13a and 13b of the FET 13 are electrically connected to each other. A state in which the the two current terminals 13a and 13b are electrically connected each other may be referred to as an on state of the FET 13, and a state in which the two current terminals 13a and 13b are not electrically connected each other may be referred to as an off state of the FET 13. In the electrically connected state (the on state), the FET 13 includes a resistance (an on-resistance) between the two current terminals 13a and 13b. For example, the value of the on-resistance reduces as the voltage of the control signal increases, and increases as the voltage of the control signal reduces. As will be described later, the magnitude of an alternating current flowing between the current terminal 13a and the current terminal 13b varies according to the on-resistance (a first on-resistance) of the FET 13. For example, when the value of the on-resistance is set to be less than input impedances of the TIA circuit 14 and the TIA circuit 15, the alternating current flowing between the current terminals 13a and 13b increases. In this way, the FET 13 serves as a variable resistor. In this embodiment, elements having a significant resistance, a significant inductance, and the like between the FET 13 and the first input terminal 11 are not described. Elements having a significant resistance, a significant inductance, and the like between the FET 13 and the second input terminal 12 are also not described. The FET 13 is connected to the first and second input terminals 11 and 12 at an impedance sufficiently lower than the on-resistance of the FET 13, for example.

The TIA circuit 14 is a first TIA circuit in this embodiment. The TIA circuit 14 includes an inverting amplifier 14a and a feedback resistor 14b. Specifically, an output terminal of the inverting amplifier 14a is connected to an input terminal of the inverting amplifier 14a via the feedback resistor 14b. That is, the output of the inverting amplifier 14a is fed back to the input of the inverting amplifier 14a via the feedback resistor 14b. An input terminal 14c (a first input node) of the TIA circuit 14 is electrically connected to a node N1 via a line in the receiving circuit 10A. The node N1 is a node between the current terminal 13a of the FET 13 and the first input terminal 11. The TIA circuit 14 receives a remaining current signal Ipd3 other than a partial current signal flowing to the FET 13 out of the current signal Ipd1 and converts the current signal Ipd3 to a voltage signal S1. The voltage signal S1 has a voltage value corresponding to the magnitude of the current signal Ipd3. When the FET 13 has the on state, the magnitude (amplitude) of an AC component of the current signal Ipd3 is less than the magnitude (amplitude) of an AC component of the current signal Ipd1 because a part of the current signal Ipd1 flows to the FET 13. Since the inverting amplifier 14a performs inverse amplification, for example, the voltage signal S1 reduces to a low voltage side when the voltage of the input terminal 14c of the TIA circuit 14 increases to a high voltage side. On the other hand, the voltage signal S1 increases to a high voltage side when the voltage of the input terminal 14c of the TIA circuit 14 reduces to a low voltage side. The TIA circuit 14 outputs the voltage signal S1 from an output terminal 14d thereof (a first output node).

The TIA circuit 15 is a second TIA circuit in this embodiment. Similarly to the TIA circuit 14, the TIA circuit 15 includes an inverting amplifier 15a and a feedback resistor 15b. Specifically, an output terminal of the inverting amplifier 15a is connected to an input terminal of the inverting amplifier 15a via the feedback resistor 15b. An input terminal 15c (a second input node) of the TIA circuit 15 is electrically connected to a node N2 via a line in the receiving circuit 10A. The node N2 is a node between the current terminal 13b of the FET 13 and the second input terminal 12. The TIA circuit 15 receives a remaining current signal Ipd4 other than a partial current signal flowing to the FET 13 out of the current signal Ipd2 and converts the current signal Ipd4 to a voltage signal S2. The voltage signal S2 has a voltage value corresponding to the magnitude of the current signal Ipd4. The magnitude (amplitude) of an AC component of the current signal Ipd4 is less than the magnitude (amplitude) of an AC component of the current signal Ipd2 because a part of the current signal Ipd2 flows to the FET 13. Since the inverting amplifier 15a performs inverse amplification, for example, the voltage signal S2 reduces when the voltage of the input terminal 15c of the TIA circuit 15 increases. On the other hand, the voltage signal S2 increases when the voltage of the input terminal 15c of the TIA circuit 15 reduces. The TIA circuit 15 outputs the voltage signal S2 from an output terminal 15d thereof (a second output node). The voltage signals S1 and S2 are a pair of complementary voltage signals. The voltage signals S1 and S2 constitute a single differential output voltage. That is, the TIA circuit 14 and the TIA circuit 15 receive a single differential input current and output a single differential output voltage according thereto.

The electrical characteristics of the TIA circuit 14 are the same as the electrical characteristics of the TIA circuit 15. Here, the same electrical characteristics between circuits mean that elements constituting the circuits and sizes thereof are the same and connection relations between the elements (circuit configurations) are the same. Even when there is a difference in characteristics between two entities which are elements constituting the circuits, the two entities may be considered to have the same electrical characteristics as long as the characteristics of the entities belong to the specifications of the elements. The configuration of the TIA circuits 14 and 15 is not limited to the above description and various configurations can be employed as long as they have a function of converting a current to a voltage.

The buffer amplifier 16 receives a pair of voltage signals S1 and S2 and amplifiers and outputs the signals. Specifically, the buffer amplifier 16 includes a pair of input terminals 16a and 16b. The input terminal 16a is electrically connected to the output terminal 14d of the TIA circuit 14. The input terminal 16b is electrically connected to the output terminal 15d of the TIA circuit 15. The buffer amplifier 16 includes a pair of output terminals 16c and 16d. The buffer amplifier 16 outputs an amplified voltage signal S3 from the output terminal 16c. The buffer amplifier 16 outputs an amplified voltage signal S4 from the output terminal 16d. The output terminals 16c and 16d of the buffer amplifier 16 are electrically connected to output terminals 18 and 19 of the receiving circuit 10A, respectively, via lines in the receiving circuit 10A. The voltage signals S3 and S4 output from the buffer amplifier 16 are supplied to the outside of the receiving circuit 10A via the output terminals 18 and 19. For example, the buffer amplifier 16 amplifies a voltage difference (a differential output voltage) between the voltage signal S1 and the voltage signal S2 in the pair of input terminals 16a and 16b by a gain (a differential voltage gain) and outputs the amplified voltage signals S3 and S4 such that the amplified voltage difference is generated between the output terminal 18 and the output terminal 19. The buffer amplifier 16 is provided for a case in which a satisfactory output amplitude cannot be obtained by only the gains of the TIA circuits 14 and 15 including the inverting amplifier and the feedback resistor (that is, a case in which the signal light L1 and L2 is weak). The buffer amplifier 16 may be omitted in a case in which a satisfactory output amplitude is obtained by only the gains of the TIA circuits 14 and 15. In this case, the voltage signals S1 and S2 are output to the outside via the output terminals 18 and 19, respectively. The input terminal 16a is, for example, a non-inverted input terminal, the input terminal 16b is, for example, an inverted input terminal, and the buffer amplifier 16 performs non-inverse amplification. The input terminal 16a may be an inverted input terminal and the input terminal 16b may be a non-inverted input terminal. The buffer amplifier 16 may perform inverse amplification according to the logic of the signals.

The control circuit 17 includes, for example, a pair of input terminals 17a and 17b and a single output terminal 17c. The input terminal 17a is electrically connected to a node N3 via a line in the receiving circuit 10A. The node N3 is a node between the output terminal 14d of the TIA circuit 14 and the input terminal 16a of the buffer amplifier 16. The input terminal 17b is electrically connected to a node N4 via a line in the receiving circuit 10A. The node N4 is a node between the output terminal 15d of the TIA circuit 15 and the input terminal 16b of the buffer amplifier 16. The input terminal 17a of the control circuit 17 receives the voltage signal S1 before being input to the buffer amplifier 16. The input terminal 17b of the control circuit 17 receives the voltage signal S2 before being input to the buffer amplifier 16. Then, the control circuit 17 detects the voltage difference (the amplitude of the differential output voltage) between the voltage signal S1 and the voltage signal S2. The control circuit 17 may detect a difference between a temporal mean value of the voltage signal S1 (that is, the magnitude of the DC component of the voltage signal S1) and a temporal mean value of the voltage signal S2 (that is, the magnitude of the DC component of the voltage signal S2) using an integrator circuit. In this case, the input impedance of the input terminals 17a and 17b may be set, for example, to several tens of kΩ or greater. This detection of the voltage difference may be performed by analog operation using an analog circuit or may be performed by digital operation using a digital circuit after it has been subjected to A/D conversion. The control circuit 17 generates a control signal SC on the basis of the detected voltage difference and outputs the control signal SC from the output terminal 17c. Generation of the control signal SC based on the voltage difference means, for example, that the control signal SC is generated on the basis of the peak of the voltage difference between the voltage signal S1 and S2, an average of the voltage difference, or both thereof. The output terminal 17c is electrically connected to the control terminal 13c of the FET 13. The control signal SC is supplied to the control terminal 13c of the FET 13. For example, the control circuit 17 may be a digital operating device having an A/D conversion function and a D/A conversion function or may be a computer (or a microcomputer) including a CPU and a memory. In this case, a digital operating device may be provided outside of the receiving circuit 10A and the control circuit 17 may perform processes required for generating the control signal SC while communicating with the digital operating device.

Figure 2:
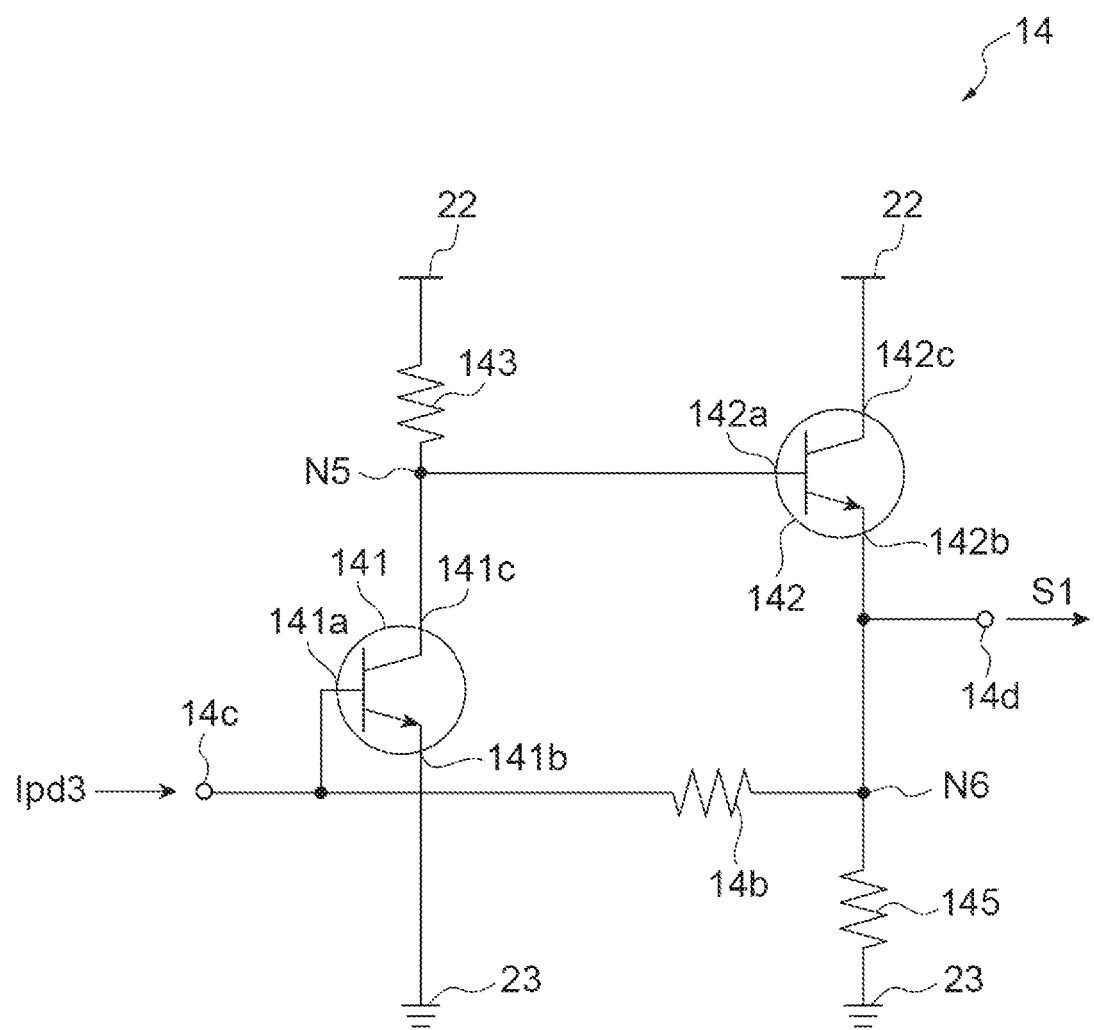
FIG. 2 is a circuit diagram illustrating an example of a configuration of a first transimpedance amplifier (TIA) circuit.

FIG. 2 is a circuit diagram illustrating an example of a configuration of the TIA circuit 14. The TIA circuit 14 includes the input terminal 14c and the output terminal 14d. The current signal Ipd3 is input to the input terminal 14c. The voltage signal S1 is output from the output terminal 14d.

The TIA circuit 14 includes an NPN transistor 141 (a first NPN transistor) and an NPN transistor 142 (a second NPN transistor). A base terminal 141a of the transistor 141 is connected to the input terminal 14c. An emitter terminal 141b of the transistor 141 is connected to a reference potential line (a grounding line) 23. This is a so-called grounded emitter circuit. A collector terminal 141c of the transistor 141 is connected to a power supply line 22 via a resistor 143. A base terminal 142a of the transistor 142 is connected to a node N5 between the resistor 143 and the transistor 141. An emitter terminal 142b of the transistor 142 is connected to the reference potential line 23 via a resistor 145. A collector terminal 142c of the transistor 142 is connected to the power supply line 22. A node N6 between the emitter terminal 142b of the transistor 142 and the resistor 145 is connected to the input terminal 14c via the feedback resistor 14b.

In the circuit illustrated in FIG. 2, an input voltage of the TIA circuit 14 is a base-emitter voltage of the transistor 141. When it is assumed that no current flows in the feedback resistor 14b, a voltage Vcc−Vbe1−Vbe2 is applied across the resistor 143. Vcc denotes a voltage value of the power supply line 22, Vbe1 denotes the base-emitter voltage of the transistor 141, and Vbe2 denotes the base-emitter voltage of the transistor 142. Accordingly, a current flowing in the collector terminal 141c of the transistor 141 is (Vcc−Vbe1−Vbe2)/RL, where RL denotes a resistance of the resistor 143. When the collector current of the transistor 141 is fixed, the base-emitter voltage of the transistor 141 is also fixed. That is, the base-emitter voltage Vbe1 of the transistor 141 has a value satisfying the following expression.

$$Ic = Is \cdot \{\exp(Vbe1/nVt) - 1\}$$

Here, in the expression, Ic denotes the collector current of the transistor 141. Is denotes a saturation current and is a positive real number which is determined depending on a type of a device, and n denotes a coupling coefficient. Theoretically, n=1 is set, but is determined depending on a type of a device and is generally a real number satisfying 1<n<2. Vt denotes a thermal voltage and is defined as $Vt = k_B \cdot T/q_e$. Here, $k_B$ denotes the Boltzmann's constant, $q_e$ denotes an elementary charge, and T denotes the absolute temperature of the transistor 141.

Figure 3:
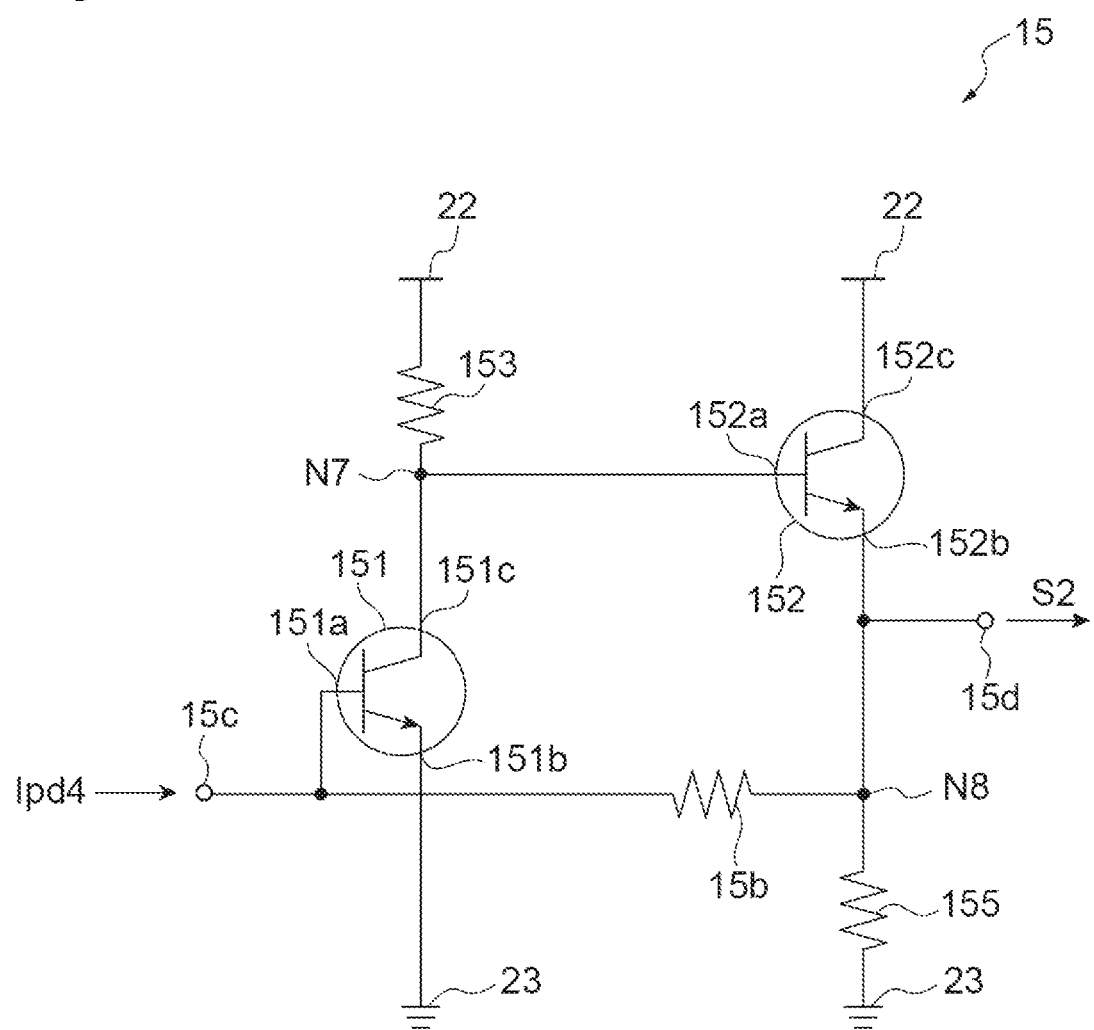
FIG. 3 is a circuit diagram illustrating an example of a configuration of a second TIA circuit.

FIG. 3 is a circuit diagram illustrating an example of a configuration of the TIA circuit 15. The TIA circuit 15 includes the input terminal 15c and the output terminal 15d. The current signal Ipd4 is input to the input terminal 15c. The voltage signal S2 is output from the output terminal 15d.

The TIA circuit 15 includes an NPN transistor 151 (a third NPN transistor) and an NPN transistor 152 (a fourth NPN transistor). A base terminal 151a of the transistor 151 is connected to the input terminal 15c. An emitter terminal 151b of the transistor 151 is connected to the reference potential line (the grounding line) 23. This is a so-called grounded emitter circuit. A collector terminal 151c of the transistor 151 is connected to the power supply line 22 via a resistor 153. A base terminal 152a of the transistor 152 is connected to a node N7 between the resistor 153 and the transistor 151. An emitter terminal 152b of the transistor 152 is connected to the reference potential line 23 via a resistor 155. A collector terminal 152c of the transistor 152 is connected to the power supply line 22. A node N8 between the emitter terminal 152b of the transistor 152 and the resistor 155 is connected to the input terminal 15c via the feedback resistor 15b.

As described above, the electrical characteristics of the TIA circuit 14 are the same as the electrical characteristics of the TIA circuit 15. Specifically, for example, the transistor 151 has the same transistor structure as a transistor structure of the transistor 141. The transistor 152 has the same transistor structure as a transistor structure of the transistor 142. For example, the transistor 151 has an area of an emitter region equal to an area of an emitter region of the transistor 141. The transistor 152 has an area of an emitter region equal to an area of an emitter region of the transistor 142. The resistor 143 has the same resistance as a resistance of the resistor 153. The resistor 145 has the same resistance as a resistance of the resistor 155. The feedback resistor 14b has the same resistance as a resistance of the feedback resistor 15b. Even when there is a difference in characteristics between two entities which are circuit elements such as a transistor or a resistor, the two entities may be considered to have the same electrical characteristics as long as the characteristics thereof belong to the specifications of the circuit elements.

In the circuit illustrated in FIG. 1, the temporal mean values (DC components) of the input voltages of the TIA circuits 14 and 15 are independent of each other. Accordingly, in consideration of unevenness, the DC components of the input voltages of the TIA circuits 14 and 15 are not strictly the same voltage. Although, a difference therebetween is small and rarely affects the operation of the optical receiver 1A. When the voltage value of the DC component of the input voltage of the TIA circuit 14 is the same as the voltage value of the DC component of the input voltage of the TIA circuit 15, an alternating current can flow between two current terminals 13a and 13b by turning on the FET 13, but a direct current does not flow therebetween. When an in-phase component and an anti-phase component as a pair of complementary signals constitute a differential signal, a difference between the temporal mean value of the voltage of the in-phase component and the temporal mean value of the voltage of the anti-phase component is referred to as an offset voltage. When there is an offset voltage between the input voltages of the TIA circuits 14 and 15, there is also an offset voltage between the output voltages of the TIA circuits 14 and 15. By detecting the offset voltage between the output voltages of the TIA circuits 14 and 15, it is possible to perform feedback control for decreasing the offset voltage between the input voltages of the TIA circuits 14 and 15. With such feedback control of an offset voltage, it is possible to minimize the offset voltage between the input voltages of the TIA circuits 14 and 15 to a sufficiently small value.

Operations and advantages of the optical receiver 1A and the receiving circuit 10A according to this embodiment having the aforementioned configuration will be described below. When the signal light L1 and L2 is input to the optical receiver 1A, the signal light L1 is converted to the current signal Ipd1 by the photodetector 3a and the signal light L2 is converted to the current signal Ipd2 by the photodetector 3b. The current signal Ipd1 is converted to the voltage signal S1 by the TIA circuit 14 of the receiving circuit 10A and the current signal Ipd2 is converted to the voltage signal S2 by the TIA circuit 15 of the receiving circuit 10A. A voltage difference between the voltage signal S1 and the voltage signal S2 indicates a current difference between the current signal Ipd1 and the current signal Ipd2 and also indicates a light intensity difference between the signal light L1 and the signal light L2. The voltage signals S1 and S2 are amplified by the buffer amplifier 16 and are output to the outside of the receiving circuit 10A.

In this embodiment, the FET 13 is connected between the first input terminal 11 and the second input terminal 12. The current signal Ipd1 input from the first input terminal 11 is in reverse phase (complementary) to the current signal Ipd2 input from the second input terminal 12. Accordingly, when a gate voltage greater than a threshold voltage is applied to the control terminal 13c of the FET 13, a current signal Ipd5 having a magnitude corresponding to the gate voltage flows between the current terminals 13a and 13b of the FET 13. As the gate voltage of the FET 13 increases, the current signal Ipd3 flowing from the first input terminal 11 to the TIA circuit 14 and the current signal Ipd4 flowing from the second input terminal 12 to the TIA circuit 15 reduce. That is, when the current signal Ipd5 flows in the FET 13, the amplitude of the current signals Ipd3 and Ipd4 input to the TIA circuits 14 and 15 become smaller even with the constant amplitude of the signal light L1 and L2. The amplitude of the voltage difference between the voltage signals S1 and S2 is minimized to being less than a predetermined value.

The control terminal 13c of the FET 13 is supplied with a control signal SC from the control circuit 17. The control signal SC can be determined such that the amplitude of the voltage difference (a differential output voltage) between the voltage signal S1 output from the TIA circuit 14 and the voltage signal S2 output from the TIA circuit 15 is minimized. That is, when the amplitude of the current signals Ipd1 and Ipd2 is small and the amplitude of the voltage difference between the voltage signals S1 and S2 is less than a predetermined value (threshold value), the voltage value of the control signal SC output from the control circuit 17, that is, the gate voltage of the FET 13, is small and the FET 13 is in the off state. Accordingly, the current signal Ipd3 is the same as the current signal Ipd1, and the current signal Ipd4 is the same as the current signal Ipd2. On the other hand, when the amplitude of the current signals Ipd1 and Ipd2 is large and the amplitude of the voltage difference between the voltage signals S1 and S2 is equal to or greater than the threshold value, the control circuit 17 turns on the FET 13 to curb an increase in amplitude of the current signals Ipd 3 and Ipd4 input to the TIA circuits 14 and 15 by setting the voltage value of the control signal SC to be greater than the threshold voltage of the FET 13. At this time, for example, the control signal SC may be adjusted such that the amplitude of the voltage difference between the voltage signals S1 and S2 is not greater than a predetermined value and is almost constant Here, the predetermined value is, for example, an amplitude value at which the amplitude of the voltage signals S1 and S2 are limited and reach a saturated state. When the amplitude of the voltage signals S1 and S2 are limited and reach a saturated state, linearity of the current signals Ipd3 and Ipd4 deteriorates.

The specific operation thereof is described as follows. Here, an input admittance of the TIA circuit 14 and 15 is $Y_{IN}$, and an input admittance of the FET 13 as seen from the current terminals 13a and 13b of the FET 13 is $Y_{M1}$. When the FET 13 is turned on, the input impedance of the FET 13 reduces and the input admittance $Y_{M1}$ thereof increases. When the magnitude of the signal component of the current signals Ipd1 and Ipd2 is $I_{pd}$ and the magnitude of the signal component of the current signals Ipd3 and Ipd4 input to the TIA circuits 14 and 15 is $I_{in}$, $I_{in}=Y_{IN}/(Y_{IN}+Y_{M1}) \cdot I_{pd}$ is satisfied. Accordingly, when the FET 13 is turned on and the value of $I_{M1}$ increases, $I_{in}$ reduces. That is, since the on-resistance of the FET 13 reduces and the input admittance $Y_{M1}$ increases by increasing the voltage value of the control signal SC, the amplitude of the signal component of the current signals Ipd3 and Ipd4 input to the TIA circuits 14 and 15 can be made to be less than the amplitude of the signal component of the current signals Ipd1 and Ipd2.

As described above, with the optical receiver 1A and the receiving circuit 10A according to this embodiment, it is possible to curb an increase in amplitude of the current signals input to the TIA circuits 14 and 15 even when the amplitude of the signal light L1 and L2 increases. That is, it is possible to reduce the amplitude of the current signals Ipd3 and IPd4. Accordingly, it is possible to prevent the amplitude of the voltage signals S1 and S2 from tending to a limit, to reduce distortion in the TIA circuits 14 and 15, and to enhance linearity of a reception signal.

As in this embodiment, the electrical characteristics of the TIA circuit 14 may be the same as the electrical characteristics of the TIA circuit 15. For example, the TIA circuit 14 may have the same circuit configuration as the TIA circuit 15 and circuit elements such as transistors or resistors constituting the circuits may have the same electrical characteristics or the same circuit constants in the TIA circuit 14 and the TIA circuit 15. In this case, by using the FET 13 which is provided common to the TIA circuits 14 and 15, it is possible to equivalently minimize the amplitude of the current signal input to the TIA circuit 14 and the amplitude of the current signal input to the TIA circuit 15.

Figure 4:
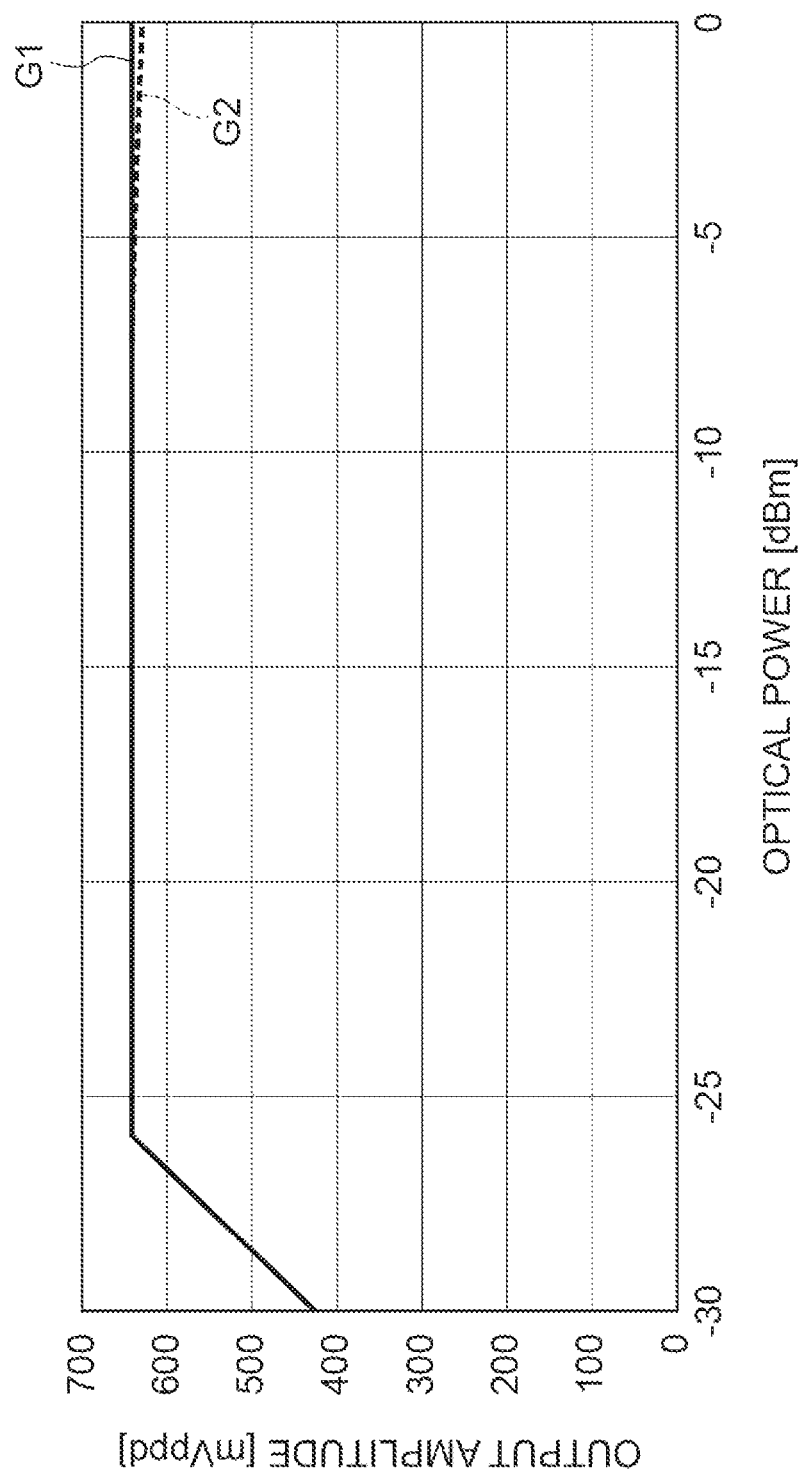
FIG. 4 is a diagram illustrating a relationship between a signal light intensity and the amplitude of a differential voltage signal (output amplitude) in a receiving circuit.
Figure 5:
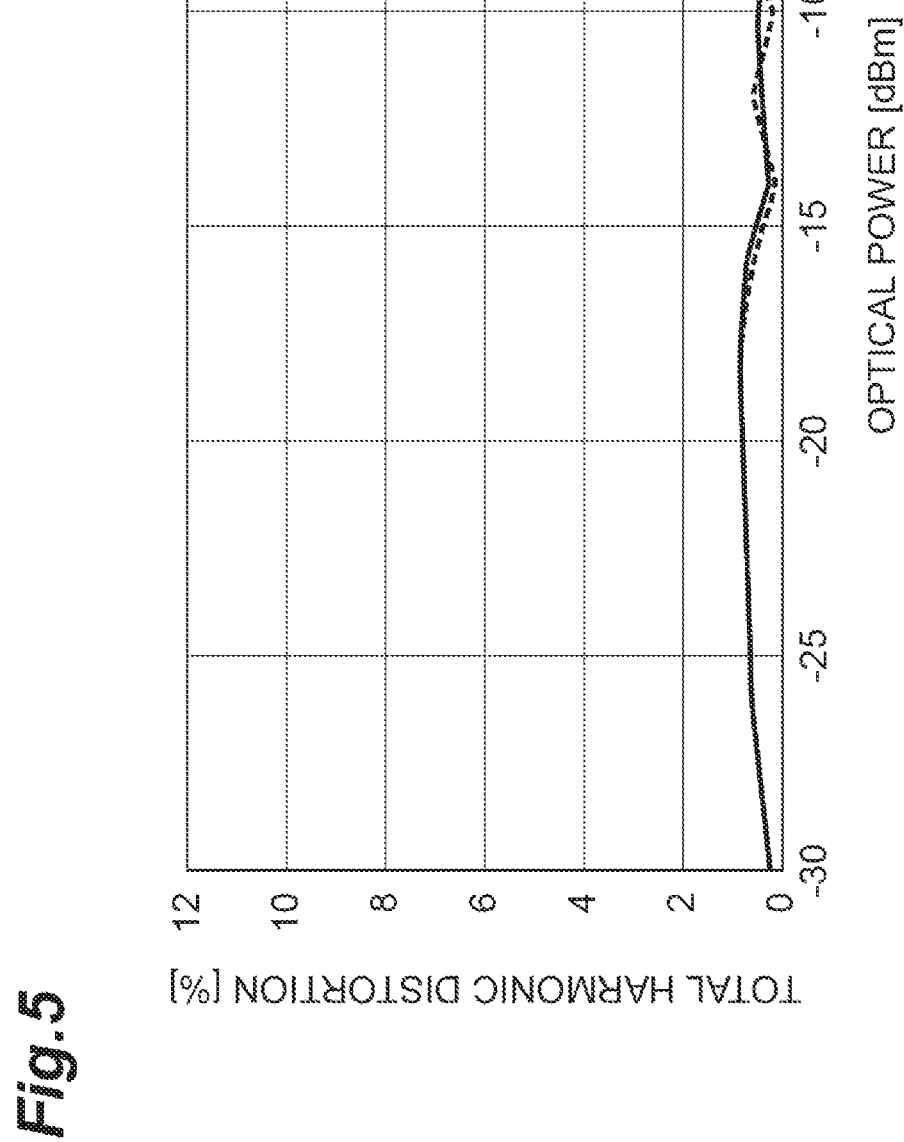
FIG. 5 is a diagram illustrating a relationship between a signal light intensity and a total harmonic distortion of a reception signal in a receiving circuit.

FIGS. 4 and 5 illustrate simulation results indicating the aforementioned advantages of the receiving circuit 10A according to this embodiment. FIG. 4 is a diagram illustrating a relationship between a signal light intensity (optical power) and the amplitude (output amplitude) of a voltage difference (a differential output voltage) between the voltage signals S1 and S2. In FIG. 4, the horizontal axis represents the optical power (unit: dBm) and the vertical axis represents the output amplitude (unit: mVppd). FIG. 5 is a diagram illustrating a relationship between a signal light intensity (optical power) and total harmonic distortion of a reception signal. In FIG. 5, the horizontal axis represents the optical power (unit: dBm) and the vertical axis represents the total harmonic distortion (unit: %). In this simulation, the signal frequency of the signal light L1 and L2 is set to 1 GHz. Solid lines G1 and G3 in the drawings denote a case in which the FET 13 and the control circuit 17 are activated. Dotted lines G2 and G4 denote a case in which the FET 13 and the control circuit 17 are not activated for the purpose of comparison.

Referring to FIGS. 4 and 5, when the FET 13 and the control circuit 17 are not activated (the dotted lines G2 and G4), the total harmonic distortion in an optical power of −10 dBm or greater increases by about 10%. On the other hand, when the FET 13 and the control circuit 17 are activated (the solid lines G1 and G3), it can be seen that the total harmonic distortion in the optical power of −10 dBm or greater is curbed by 2% or less.

Figure 10:
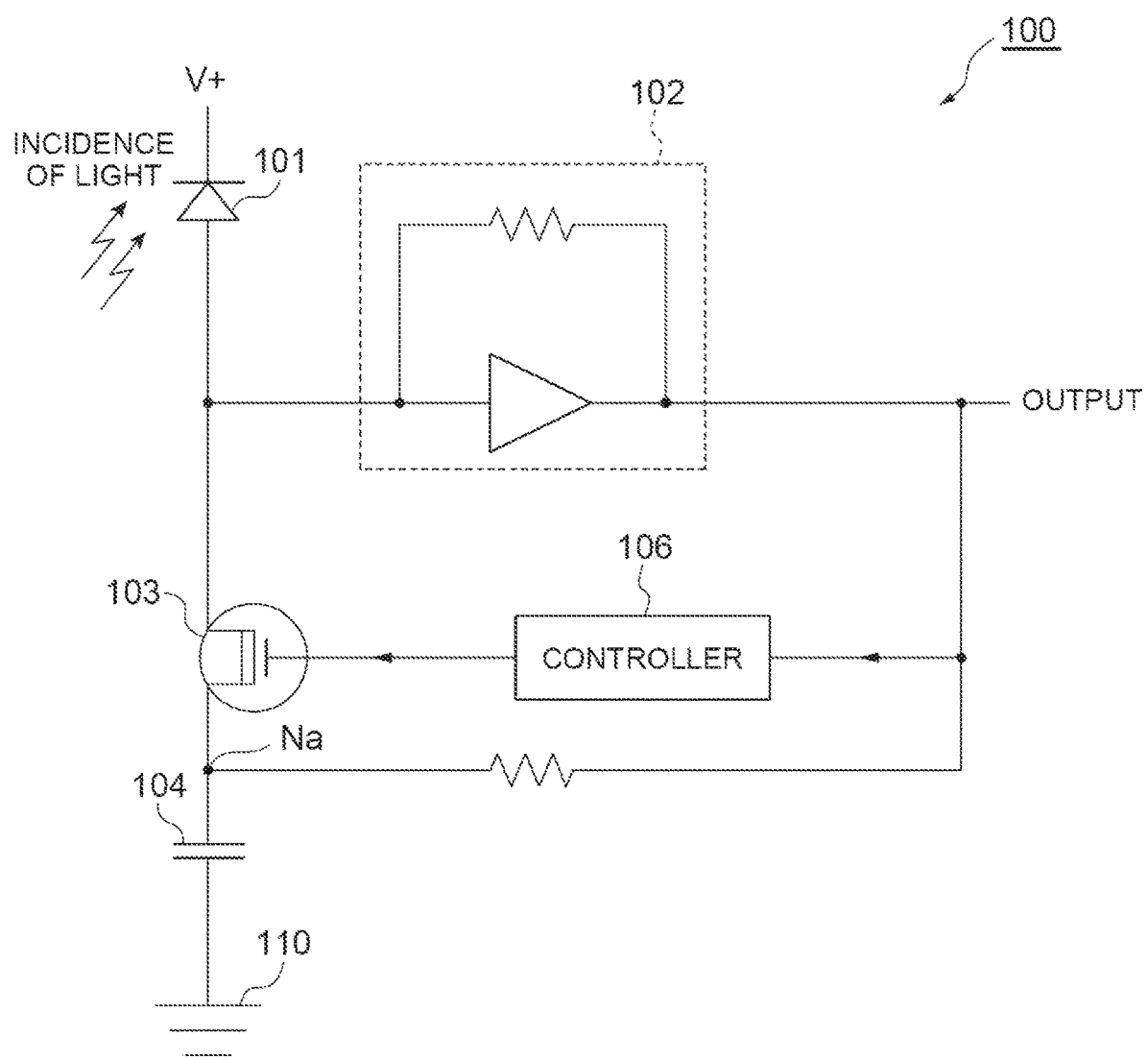
FIG. 10 is a diagram illustrating a circuit configuration in the related art.

The receiving circuit 10A according to this embodiment can be compared with a circuit according to the related art. FIG. 10 is a diagram illustrating a circuit configuration according to the related art. This circuit 100 includes a photodetector 101 and a TIA circuit 102. The photodetector 101 receives an optical signal. The TIA circuit 102 converts a photocurrent (a current signal) output from the photodetector 101 to a voltage signal. An NMOS FET 103 is connected between a node Na with a low impedance (connected to a reference potential line 110 via a capacitor 104) and an input terminal of the TIA circuit 102. A controller 106 controls a gate voltage of the FET 103 on the basis of the magnitude of the voltage signal output from the TIA circuit 102. The circuit 100 changes an amount of current flowing to the reference potential line 110 via the FET 103 according to the magnitude of the voltage signal.

However, in the circuit 100 illustrated in FIG. 10, the capacitor 104 is used to reduce the impedance of the node Na. In order to reduce the impedance in a wide frequency band, the capacitor 104 needs to have a large capacity and an increase in size of the capacitor 104 hinders a reduction in size of the optical receiver.

Figure 11:
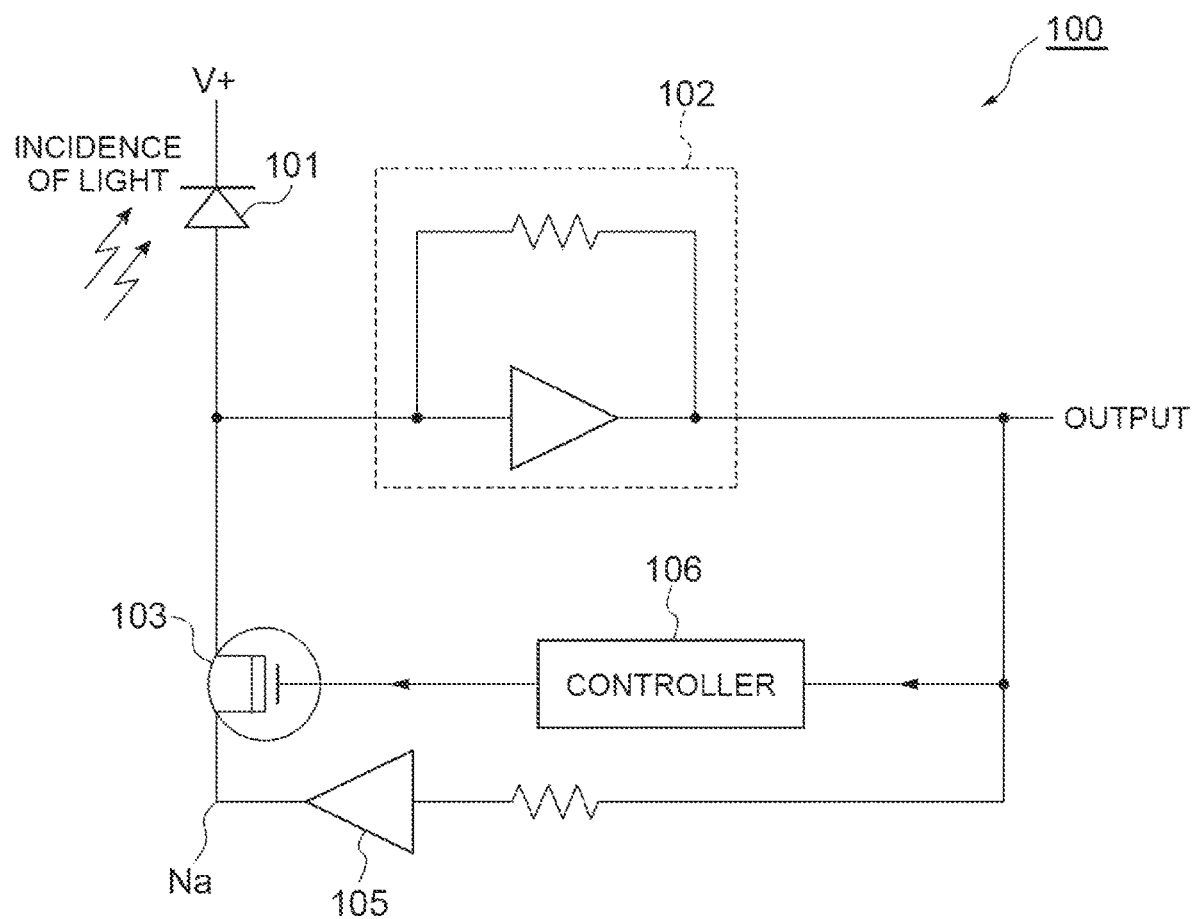
FIG. 11 is a diagram illustrating an example in which a bias circuit is provided instead of a capacitor in the circuit illustrated in FIG. 10.

FIG. 11 illustrates an example in which a bias circuit 105 is provided instead of the capacitor 104 in order to reduce the impedance of the node Na. However, in this circuit, there is concern about an increase in power consumption due to the bias circuit 105. In addition, the circuit 100 is a circuit for amplifying a single current signal. When there are two current signals as in this embodiment, two FETs 103, two controllers 106, two bias circuits 105, and two resistors between the bias circuit 105 and the TIA circuit 102 are required. Accordingly, the circuit size increases and the power consumption also increases. The receiving circuit 10A according to this embodiment requires only one FET 13 and one control circuit 17, which is advantageous for a reduction in size and a reduction in power consumption of the circuit.

With the receiving circuit 10A according to this embodiment, it is possible to curb an increase in power consumption and to improve linearity of the reception signal at high signal light power without hindering a reduction in size of an optical receiver.

Modified Examples

Figure 6:
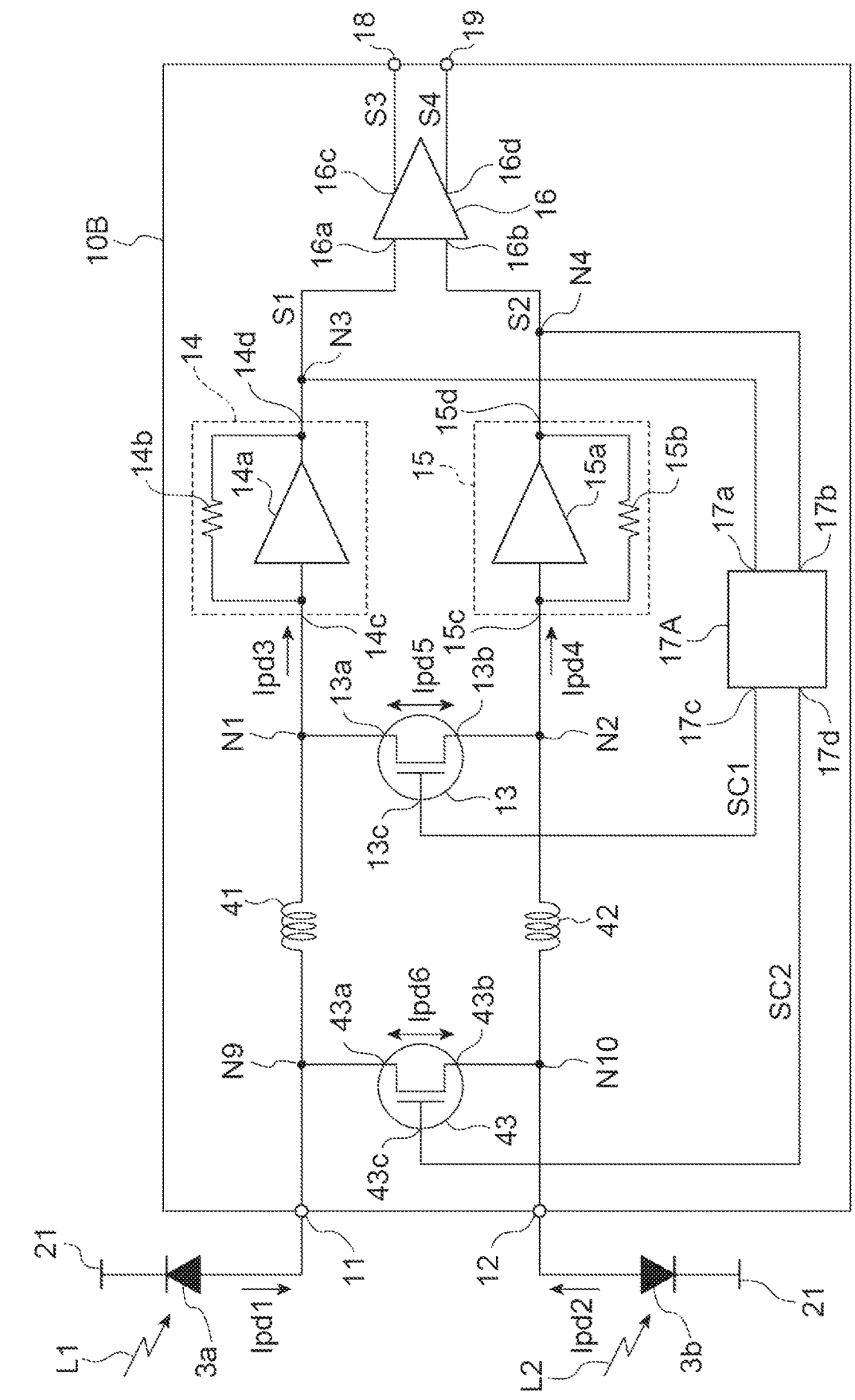
FIG. 6 is a circuit diagram illustrating a configuration of a receiving circuit according to a modified example.

FIG. 6 is a circuit diagram illustrating a configuration of a receiving circuit 10B according to a modified example of the embodiment. The receiving circuit 10B according to this modified example includes inductors 41 and 42 and an FET 43 in addition to the configuration of the receiving circuit 10A according to this embodiment.

The inductor 41 is a first inductor in this modified example. The inductor 41 is electrically connected between the node N1 and the first input terminal 11. In other words, the inductor 41 is electrically connected between the FET 13 and the first input terminal 11, and between the TIA circuit 14 and the first input terminal 11. Specifically, one end of the inductor 41 is connected to the node N1 and the other end of the inductor 41 is connected to the first input terminal 11. The inductor 42 is a second inductor in this modified example. The inductor 42 is electrically connected between the node N2 and the second input terminal 12. In other words, the inductor 42 is electrically connected between the FET 13 and the second input terminal 12 and between the TIA circuit 15 and the second input terminal 12. Specifically, one end of the inductor 42 is connected to the node N2 and the other end of the inductor 42 is connected to the second input terminal 12.

The inductors 41 and 42 are provided to improve a frequency responsiveness of the receiving circuit 10B and to reduce noise. The inductors 41 and 42 are formed of, for example, wiring patterns formed on a substrate common to the FET 13 and the TIA circuits 14 and 15, for example, a semiconductor substrate or a semiconductor chip which is obtained by dividing a semiconductor substrate. For example, the inductors 41 and 42 are spiral inductors which each are formed of a spiral wiring pattern. The inductance of the inductors 41 and 42 is in the range of, for example, 200 pH to 300 pH. The inductor 41 may have the same inductance value as the inductor 42.

For example, when the photodetectors 3a and 3b and the receiving circuits 10B are mounted on a single circuit board in a flip-chip mounting manner, a parasitic inductance generated between the photodetector 3a and the first input terminal 11 and a parasitic inductance generated between the photodetector 3b and the second input terminal 12 are about several tens of pH. These parasitic inductances are sufficiently less than the inductances of the inductors 41 and 42 to an ignorable extent. Alternatively, when the photodetectors 3a and 3b and the receiving circuit 10B are mounted on a single circuit board in a face-up mounting manner and they are connected by wire bonding, parasitic inductances therebetween are in the range of about 200 pH to 400 pH. These parasitic inductances are considered to affect frequency characteristics of the receiving circuit 10B. However, in this case, it is also possible to acquire desired frequency characteristics by adjusting the sizes (such as a gate width) of the FETs 13 and 43 as will be described later.

The FET 43 is a second FET in this modified example. The FET 43 includes two current terminals 43a and 43b (a source and a drain) and one control terminal 43c (a gate). The FET 43 is used as a variable resistor similarly to the FET 13. Accordingly, distinction between the current terminal 43a (a third current terminal) and the current terminal 43b (a fourth current terminal) is for convenience of explanation. For example, the current terminal 43a may be a source and the current terminal 43b may be a drain, or the current terminal 43a may be a drain and the current terminal 43b may be a source. Even when the two current terminals 43a and 43b are exchanged with each other, the FET 43 operates in the same way as when they are not exchanged and has the same electrical characteristics as when they are not exchanged. In this way, the FET 43 may have symmetry of the current terminals 43a and 43b.

The FET 43 is connected between the first input terminal 11 and the second input terminal 12 in order to allow an alternating current to flow between the first input terminal 11 and the second input terminal 12. The current terminal 43a of the FET 43 is electrically connected to a node N9 between one end of the inductor 41 and the first input terminal 11 via a line in the receiving circuit 10B. The current terminal 43b of the FET 43 is electrically connected to a node N10 between one end of the inductor 42 and the second input terminal 12 via a line in the receiving circuit 10B. In this modified example, elements having a significant resistance, a significant inductance, and the like between the FET 43 and the first input terminal 11 are not described. Elements having a significant resistance, a significant inductance, and the like between the FET 43 and the second input terminal 12 are also not described. The FET 43 is connected to the first and second input terminals 11 and 12 with a very low impedance.

The control circuit 17A according to this modified example further includes an output terminal 17d in addition to the input terminals 17a and 17b and the output terminal 17c of the control circuit 17 in the aforementioned embodiment. The control circuit 17A generates a control signal SC1 (a first control signal) and a control signal SC2 (a second control signal) which are voltage signals on the basis of a voltage difference (a differential output voltage) between the voltage signal S1 and the voltage signal S2. The control circuit 17A outputs the generated control signal SC1 from the output terminal 17c and outputs the generated control signal SC2 from the output terminal 17d. The output terminal 17c is electrically connected to the control terminal 13c of the FET 13 and the control signal SC1 is supplied to the control terminal 13c of the FET 13. The output terminal 17d is electrically connected to the control terminal 43c of the FET 43 and the control signal SC2 is supplied to the control terminal 43c of the FET 43. The control signals SC1 and SC2 are signals for minimizing the amplitude of the voltage difference (the differential output voltage) between the voltage signal S1 and the voltage signal S2. The control signal SC2 may be the same as the control signal SC1 or may be different from the control signal SC1. When the control signals SC1 and SC2 are the same signal, the control circuit 17A may not include the output terminal 17d. In this case, the control circuit 17A may supply the control signal SC1 output from the output terminal 17c to both the control terminal 13c of the FET 13 and the control terminal 43c of the FET 43.

When the voltage value of the voltage signal S2 is made to be greater than a predetermined value (for example, the threshold voltage of the FET 43), the FET 43 is switched to the on state and an alternating current can flow between the current terminals 43a and 43b of the FET 43 via an on-resistance (a second on-resistance). Similarly to the FET 13, when the alternating current flows in the FET 43, the magnitudes of the signal components of the current signals Ipd1 and Ipd2 in the rear stage of the FET 43 become less than the magnitudes of the signal components of the current signals Ipd1 and Ipd2 in the front stage of the FET 43. Accordingly, the TIA circuit 14 receives a remaining current signal Ipd3 other than a part of an AC component flowing to the FET 13 (a current signal Ipd5) out of a remaining current signal other than a part of the AC component flowing to the FET 43 (a current signal Ipd6) out of the current signal Ipd1. The TIA circuit 14 generates the voltage signal S1 having a voltage value corresponding to the magnitude of the current signal Ipd3. The TIA circuit 15 receives a remaining current signal Ipd4 other than a part of the AC component flowing to the FET 13 (a current signal Ipd5) out of a remaining current signal other than a part of the AC component flowing to the FET 43 (a current signal Ipd6) out of the current signal Ipd2. The TIA circuit 15 generates the voltage signal S2 having a voltage value corresponding to the magnitude of the current signal Ipd4. In this way, similarly to the FET 13, the FET 43 can also reduce the amplitude of the signal components of the current signals Ipd1 and Ipd2.

As in this modified example, the inductors 41 and 42 may be additionally provided in the configuration of the aforementioned embodiment. In this case, when an FET (e.g., the FET 13) is provided on only the rear stage of the inductors 41 and 42, there is concern about excessive peaking occurring in a high frequency band of a frequency response of the receiving circuit when the FET is in the on state. In this modified example, an FET (e.g., the FET 43) is also provided on the front stage of the inductors 41 and 42. In this case, it is possible to improve linearity of a reception signal at high signal light power and to curb variation (particularly, peaking) of a frequency response when the FETs are in the on state.

Figure 7:
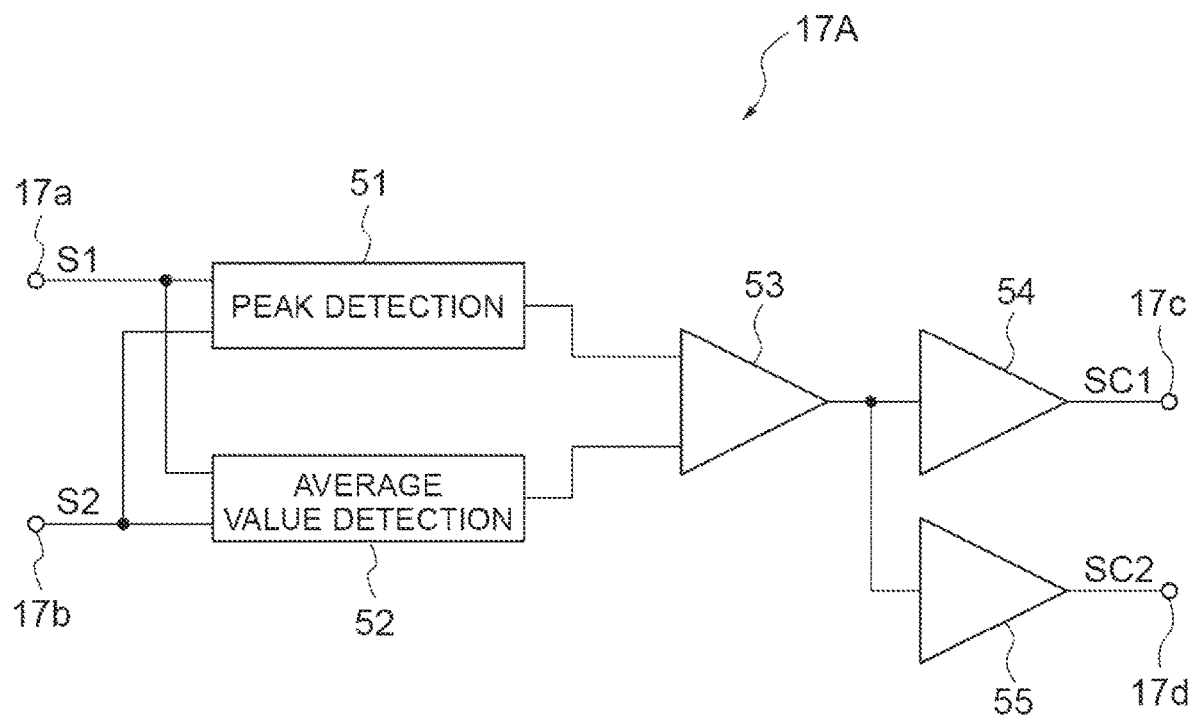
FIG. 7 is a diagram illustrating an example of a specific configuration of a control circuit.

FIG. 7 is a diagram illustrating an example of the specific configuration of the control circuit 17A. The control circuit 17A includes a peak detection circuit 51, an average value detection circuit 52, an amplifier circuit 53, and buffer circuits 54 and 55. The peak detection circuit 51 is electrically connected to the input terminals 17a and 17b. The peak detection circuit 51 receives the voltage signals S1 and S2 and detects a peak voltage (a maximum value) of a voltage difference (a differential output voltage) therebetween. The average value detection circuit 52 is electrically connected to the input terminals 17a and 17b. The average value detection circuit 52 receives the voltage signals S1 and S2 and detects an average value (a temporal mean value) of the voltage difference (the differential output voltage) therebetween. The amplifier circuit 53 is electrically connected to the peak detection circuit 51 and the average value detection circuit 52. The amplifier circuit 53 amplifies a difference between the output voltage from the peak detection circuit 51 and the output voltage from the average value detection circuit 52 and outputs the amplified difference. The amplifier circuit 53 is, for example, a differential amplifier or an operational amplifier. For example, the output voltage of the peak detection circuit 51 is input to a non-inverted input terminal (+) of the amplifier circuit 53 and the output voltage of the average value detection circuit 52 is input to an inverted input terminal (−) of the amplifier circuit 53. The amplifier circuit 53 may perform non-inverse amplification or may perform inverse amplification as long as the voltages of the control signals SC1 and SC2 are generated to increase with an increase in amplitude of the differential output voltage. The voltage signal output from the amplifier circuit 53 is branched to two voltage signals and the two voltage signals are strengthened by the buffer circuits 54 and 55. The strengthened one voltage signal is supplied as the control signal SC1 to the output terminal 17c. The other strengthened voltage signal is supplied as the control signal SC2 to the output terminal 17d. The buffer circuits 54 and 55 perform amplification of a voltage signal, conversion of a signal level, and the like, for example, in order to convert the control signals SC1 and SC2 to signals suitable for driving the FETs. As described above, when the control signal SC1 is used as the control signal SC2, the buffer circuit 55 and the output terminal 17d may be omitted. The peak detection circuit 51, the average value detection circuit 52, the amplifier circuit 53, and the buffer circuits 54 and 55 can be all constituted using the related art. Alternatively, circuits which are known well and used commonly may be employed. Description of the detailed circuit configurations and the operations thereof will be omitted.

Figure 8:
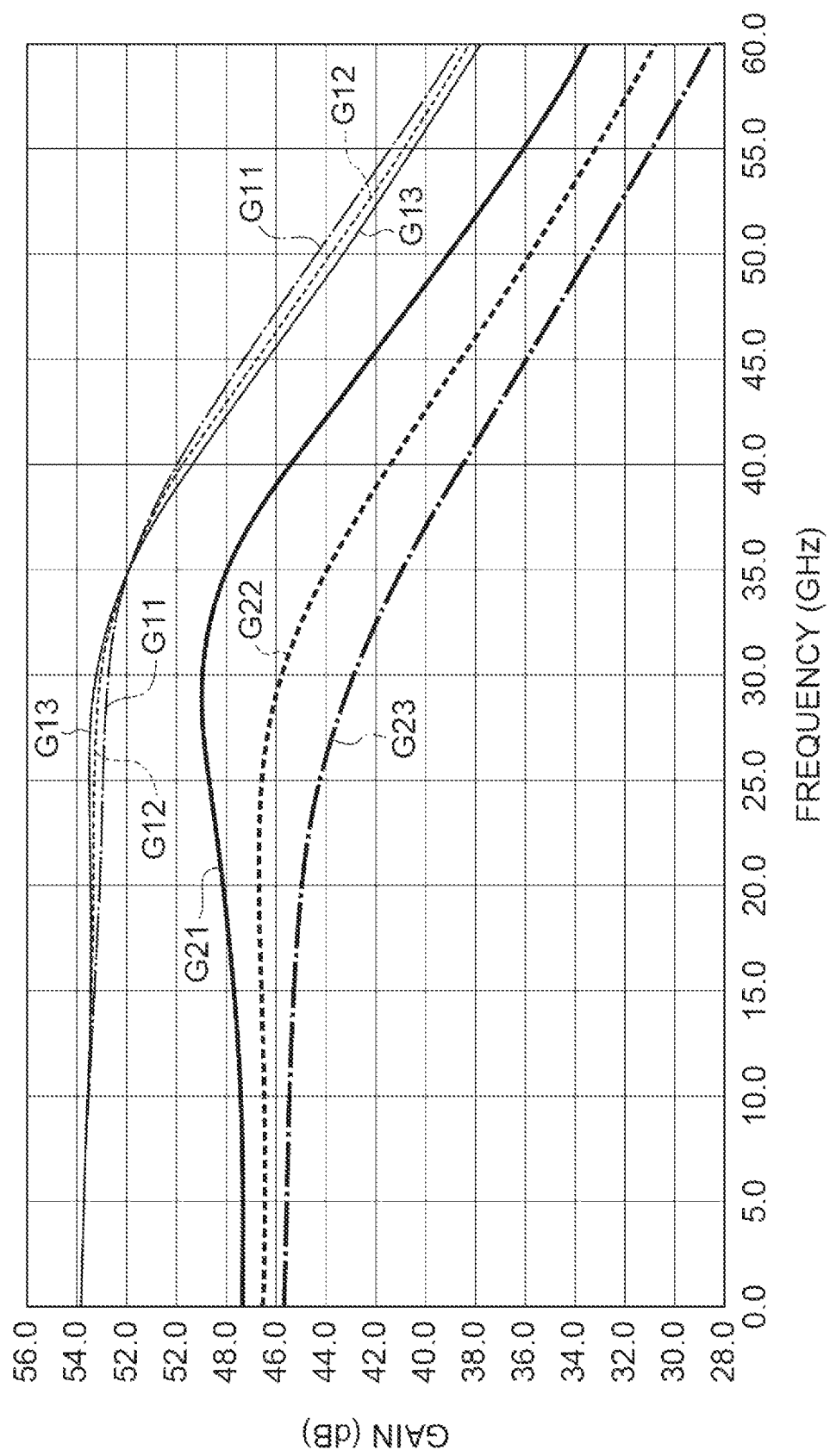
FIG. 8 is a graph illustrating frequency characteristics of a gain of a receiving circuit.

Change in frequency characteristics of the receiving circuit 10B due to change in size of the FETs 13 and 43 will be described below FIG. 8 is a graph illustrating a frequency response of a gain of the receiving circuit 10B, where the horizontal axis represents the frequency (unit: GHz) and the vertical axis represents the gain (unit: dB). Curves G11 to G13 denote the frequency response when the FETs 13 and 43 are in the off state, and curves G21 to G23 denote the frequency response when the FETs 13 and 43 are in the on state. The off state refers to a state in which two current terminals are not electrically connected to each other, and the on state refers to a state in which two current terminals are electrically connected to each other. The curves G11 and G21 denote a case in which a ratio Wg1/Wg2 is 50. The ratio Wg1/Wg2 is a ratio of a gate width Wg1 of the FET 13 to a gate width Wg2 of the FET 43. The curves G12 and G22 denote a case in which the ratio Wg1/Wg2 is 5. The curves G13 and G23 denote a case in which the ratio Wg1/Wg2 is 2.5. The transistor structure of the FET 43 other than the gate width Wg2 is the same as the transistor structure of the FET 13 other than the gate width Wg1. For example, when the transistor structures are seen from a sectional surface in which the gate is perpendicular to a direction of a field, the sizes such as the gate length, the gate-drain length, the gate-source length, the thickness of a gate oxide film, the shape of a gate electrode, the shape of a source electrode, the shape of a drain electrode, and the thickness of a semiconductor layer are equal to each other. The materials constituting the gates, the sources, the drains, and the semiconductor layers or the dopants added thereto, dopant profiles, and the like are equal to each other.

Referring to FIG. 8, when the ratio Wg1/Wg2 is 50, peaking in the vicinity of 30 GHz increases when the FETs 13 and 43 are in the on state as indicated by the curve G21. Accordingly, a difference in frequency response is remarkable between the case where the gain is large (the curve G11) and the case where the gain is small (the curve G21). These frequency response characteristics can be considered to be equivalent to those in a case in which the FET 43 is omitted. On the other hand, when the ratio Wg1/Wg2 is 5, occurrence of peaking when the FETs 13 and 43 are in the on state is curbed more than that of the curve G21 as indicated by the curve G22. The difference in frequency response characteristics is small between the case where the gain is large (the curve G12) and the case where the gain is small (the curve G22). When the ratio Wg1/Wg2 is 2.5 (the curves G13 and G23), peaking is completely curbed when the gain is small (the curve G23). Accordingly, the ratio Wg1/Wg2 may be 5 or less. Here, when the ratio Wg1/Wg2 is 2.5, the gain at 20 GHz or higher when the FETs 13 and 43 are in the on state further reduces in comparison with that when the ratio Wg1/Wg2 is 5. Accordingly, a difference in gain between the case where the gain is large (the curve G13) and the case where the gain is small (the curve G23) in a frequency band of 20 GHz or higher is large. As a result, in comparison with the case in which the ratio Wg1/Wg2 is 5 (the curve G22), the frequency band reduces by 5 GHz or greater when the ratio Wg1/Wg2 is 2.5 (the curve G23). Accordingly, in consideration of the reduce in frequency band due to the reduce in gain, the ratio Wg1/Wg2 may be greater than 2.5.

As described above, the frequency response of the gain in the receiving circuit 10B varies depending on the ratio of the gate widths of the FETs 13 and 43. Accordingly, the ratio of the gate widths of the FETs 13 and 43 can be adjusted to acquire desired frequency characteristics. In the above description, the relationship in size between the FETs 13 and 43 is expressed by the ratio of the gate widths, but the ratio of the gate widths may be considered to be replaced with an impedance ratio. Since an impedance has a relationship opposite to the gate width, a ratio Z1/Z2 of the impedance Z1 of the FET 13 to the impedance Z2 of the FET 43 may be ⅕ or greater or may be less than ⅖. For example, the gate width of the FET 43 may be set to be equal to the gate width of the FET 13, and the control circuit 17A may control the ratio Z1/Z2 to be a desired value by adjusting the voltages of the control signals SC1 and SC2.

Figure 9:
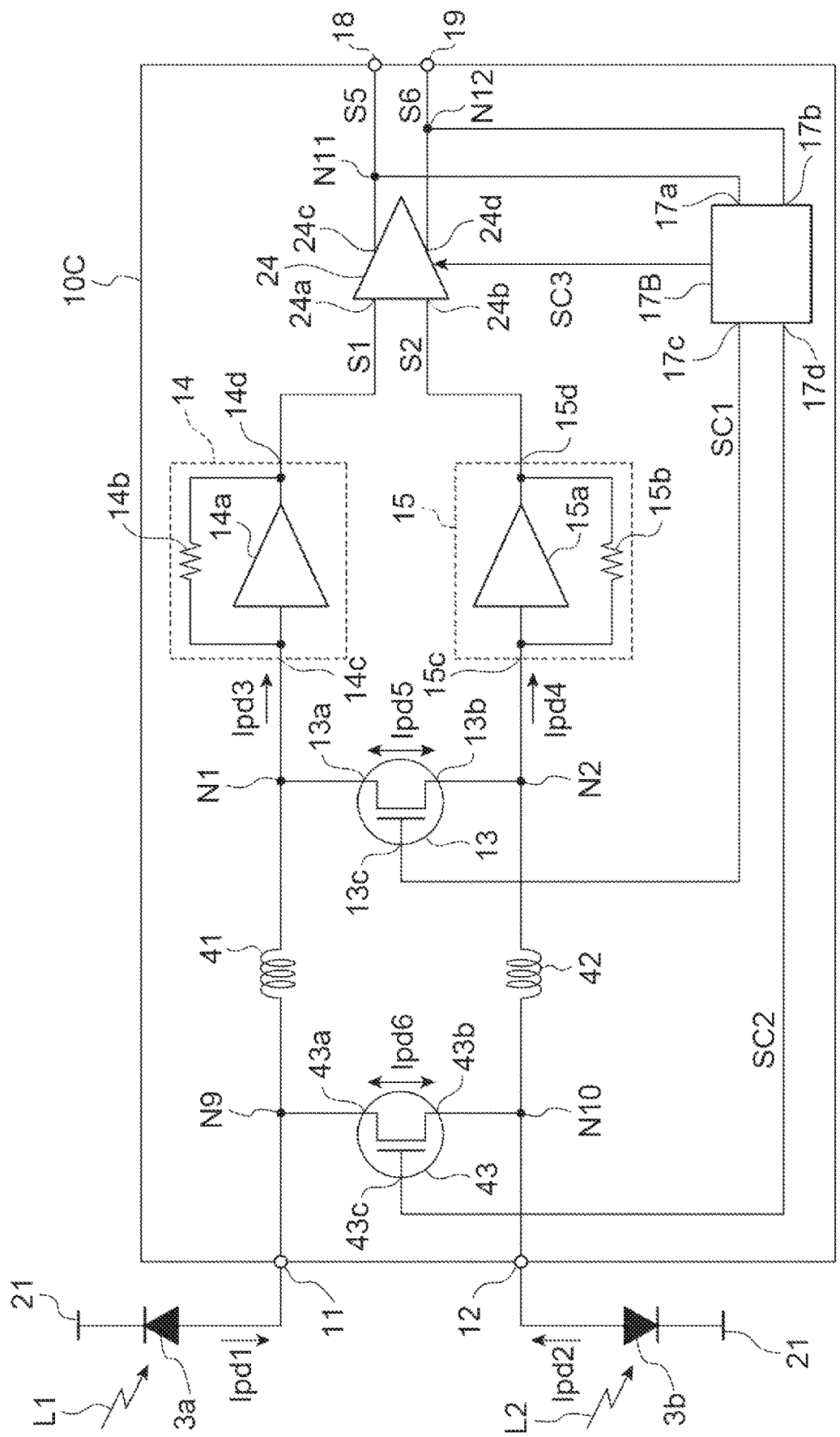
FIG. 9 is a circuit diagram illustrating a configuration of a receiving circuit according to another modified example.

FIG. 9 is a circuit diagram illustrating a configuration of a receiving circuit 10C according to another modified example. The receiving circuit 10C according to this modified example is different from the receiving circuit 10B (see FIG. 6) in that a variable-gain amplifier (VGA) 24 is provided instead of the buffer amplifier 16 and an object connected to the control circuit 17A is different.

The VGA 24 receives voltage signals S1 and S2 constituting a differential voltage signal and amplifies and outputs the received signals. Specifically, the VGA 24 includes a pair of input terminals 24a and 24b, the input terminal 24a is electrically connected to the output terminal 14d of the TIA circuit 14, and the input terminal 24b is electrically connected to the output terminal 15d of the TIA circuit 15. The VGA 24 includes a pair of output terminals 24c and 24d, outputs an amplified voltage signal S5 from the output terminal 24c, and outputs an amplified voltage signal S6 from the output terminal 24d. The output terminals 24c and 24d of the VGA 24 are electrically connected to the output terminals 18 and 19 of the receiving circuit 10C via lines in the receiving circuit 10C. The voltage signals S5 and S6 output from the VGA 24 are supplied as reception signals to the outside of the receiving circuit 10C via the output terminals 18 and 19. The gain of the VGA 24 that amplifies the voltage signals S1 and S2 is variable. The gain of the VGA 24 varies depending on a control signal SC3 from a control circuit 17B.

An input terminal 17a of the control circuit 17B is electrically connected to a node N11 between the VGA 24 and the output terminal 18. The voltage signal S5 amplified by the VGA 24 is input to the input terminal 17a. An input terminal 17b of the control circuit 17B is electrically connected to a node N12 between the VGA 24 and the output terminal 19. The voltage signal S6 amplified by the VGA 24 is input to the input terminal 17b. The control circuit 17B maintains the amplitude of a voltage difference between the voltage signals 55 and S6 output from the output terminals 18 and 19 so as not to exceed a predetermined value. The predetermined value is, for example, an amplitude value with which the amplitude of the voltage signals S5 and S6 are limited and reach a saturated state. When the amplitude of the voltage signals S5 and S6 are limited and reach a saturated state, linearity of the current signals Ipd3 and Ipd4 deteriorates. The control circuit 17B detects the amplitude of the voltage difference between the voltage signals S5 and S6 and controls the gain of the VGA 24 depending on the result of detection (Auto Gain Control: AGC). The other configuration and operation of the control circuit 17B are the same as those of the control circuit 17A according to the aforementioned modified example and thus detailed description thereof will be omitted.

Since the receiving circuit 10C includes the VGA 24 in this way, it is possible to realize a receiving circuit in which the gain can be increased when signal light L1 and L2 is weak and which has excellent linearity due to its wide dynamic range. In the configuration illustrated in FIG. 9, the control circuit 17B generates the control signals SC1 to SC3 for the VGA 24 and the FETs 13 and 43 on the basis of the voltage amplitude of the output signals from the VGA 24. Since the control signals SC1 to SC3 for the VGA 24 and the FETs 13 and 43 are uniquely generated from the voltage amplitude of the output signal from the VGA 24, it is possible to stably control the amplitude of the output signal from the VGA 24 without overlapping the feedback control loop. Since the control circuits do not need to be individually provided for the VGA 24 and the FETs 13 and 43, it is possible to curb an increase in circuit area and power consumption. For example, the variable gain in the VGA 24 is equal to or greater than 25 dB, and the variable gains in the TIA circuits 14 and 15 are about 7 dB. Accordingly, a total of the variable gains can be 30 dB or greater.

The receiving circuit and the optical receiver according to the invention are not limited to the aforementioned embodiment and can be modified in various forms. For example, the photodetectors 3a and 3b and the receiving circuit 10A (10B or 10C) are provided as individual chips in the aforementioned embodiment, but they may be incorporated into a single package.

What is claimed is:

1. A receiving circuit configured to generate a first voltage signal and a second voltage signal in accordance with a first current signal output from a first photodetector and a second current signal output from a second photodetector, the receiving circuit comprising:
   a first input terminal configured to receive the first current signal;
   a second input terminal configured to receive the second current signal;
   a first field effect transistor (FET) having a first control terminal, a first current terminal, and a second current terminal, the first current terminal being electrically connected to the first input terminal, the second current terminal being electrically connected to the second input terminal, the first control terminal receiving a first control signal;
   a first transimpedance amplifier (TIA) circuit having a first input node and a first output node, the first input node being electrically connected to the first current terminal of the first FET, the first TIA circuit being configured to convert a current signal received at the first input node to the first voltage signal and output the first voltage signal from the first output node;
   a second TIA circuit having a second input node and a second output node, the second input node being electrically connected to the second current terminal of the first FET, the second TIA circuit being configured to convert a current signal received at the second input node to the second voltage signal and output the second voltage signal from the second output node; and
   a control circuit configured to generate the first control signal in accordance with a voltage difference between the first voltage signal and the second voltage signal.

2. The receiving circuit according to claim 1, wherein the control circuit reduces a first resistance between the first current terminal and the second current terminal of the first FET by varying the first control signal when an amplitude of the voltage difference becomes larger than a certain voltage value.

3. The receiving circuit according to claim 1, wherein the second TIA circuit has the same electrical characteristics as the electrical characteristics of the first TIA circuit.

4. An optical receiver comprising:
   the first photodetector outputting the first current signal according to claim 1;
   the second photodetector outputting the second current signal according to claim 1; and
   the receiving circuit according to claim 1, wherein
   the first input terminal of the receiving circuit is electrically connected to the first photodetector, and
   the second input terminal of the receiving circuit is electrically connected to the second photodetector.

5. The receiving circuit according to claim 1, wherein the first TIA circuit includes a first NPN transistor and a second NPN transistor,
   the second TIA circuit includes a third NPN transistor and a fourth NPN transistor,
   the first NPN transistor has a base connected to the first input node,
   the first NPN transistor has a collector connected to a base of the second NPN transistor,
   the second NPN transistor has an emitter connected to the first output node,
   the third NPN transistor has a base connected to the second input node,
   the third NPN transistor has a collector connected to a base of the fourth NPN transistor, and
   the fourth NPN transistor has an emitter connected to the second output node.

6. The receiving circuit according to claim 5, wherein the third NPN transistor has an area of an emitter region equal to an area of an emitter region of the first NPN transistor, and the fourth NPN transistor has an area of an emitter region equal to an area of an emitter region of the second NPN transistor.

7. The receiving circuit according to claim 5, wherein the third NPN transistor has a same transistor structure as a transistor structure of the first NPN transistor, and the fourth NPN transistor has the same transistor structure as a transistor structure of the second NPN transistor.

8. The receiving circuit according to claim 1 further comprising:
   a first inductor electrically connected between the first input terminal and a first connecting node between the first current terminal of the first FET and the first input node of the first TIA circuit;
   a second inductor electrically connected between the second input terminal and a second connecting node between the second current terminal of the first FET and the second input node of the second TIA circuit; and
   a second FET having a second control terminal, a third current terminal, and a fourth current terminal, the third current terminal being electrically connected between the first input terminal and the first inductor, the fourth current terminal being electrically connected between the second input terminal and the second inductor, the second control terminal receiving a second control signal,
   wherein the control circuit is configured to generate the second control signal in accordance with the voltage difference.

9. The receiving circuit according to claim 8, wherein the control circuit reduces a second resistance between the third current terminal and the fourth current terminal of the second FET by varying the second control signal when an amplitude of the voltage difference becomes larger than a certain voltage value.

10. The receiving circuit according to claim 8, wherein
the first FET has a first gate width Wg1 and a first cross-sectional structure perpendicular to a direction of the first gate width Wg1,
the second FET has a second gate width Wg2 and a second cross-sectional structure perpendicular to a direction of the second gate width Wg2,
the first gate width Wg1 and the second gate width Wg2 satisfy a relation of Wg1/Wg2<5, and
the second cross-sectional structure is the same as the first cross-sectional structure.

11. The receiving circuit according to claim 8, wherein
the first FET has a first impedance Z1 between the first current terminal and the second current terminal,
the second FET has a second impedance Z2 between the third current terminal and the fourth current terminal, and
the first impedance Z1 and the second impedance Z2 satisfy a relation of $1/5 < Z1/Z2 < 2/5$.

12. An optical receiver comprising:
the first photodetector outputting the first current signal according to claim 1;
the second photodetector outputting the second current signal according to claim 1; and
the receiving circuit according to claim 8, wherein
the first input terminal of the receiving circuit is electrically connected to the first photodetector, and
the second input terminal of the receiving circuit is electrically connected to the second photodetector.

* * * * *